US012628647B2

(12) United States Patent
Choi

(10) Patent No.: US 12,628,647 B2
(45) Date of Patent: May 12, 2026

(54) SEMICONDUCTOR PACKAGE HAVING HEAT EMITTING POST BONDED THERETO AND METHOD OF MANUFACTURING THE SAME

(71) Applicant: JMJ Korea Co., Ltd., Busan (KR)

(72) Inventor: Yun Hwa Choi, Busan (KR)

(73) Assignee: JMJ Korea Co., Ltd., Busan (KR)

( * ) Notice: Subject to any disclaimer, the term of this patent is extended or adjusted under 35 U.S.C. 154(b) by 408 days.

(21) Appl. No.: 18/239,126

(22) Filed: Aug. 29, 2023

(65) Prior Publication Data

US 2024/0297096 A1 Sep. 5, 2024

(30) Foreign Application Priority Data

Mar. 3, 2023 (KR) ........................ 10-2023-0028163

(51) Int. Cl.
| | |
|---|---|
| *H01L 23/00* | (2006.01) |
| *H10W 40/47* | (2026.01) |
| *H10W 70/66* | (2026.01) |
| *H10W 90/00* | (2026.01) |
| *H10W 72/00* | (2026.01) |
| *H10W 90/20* | (2026.01) |

(52) U.S. Cl.
CPC .......... *H10W 40/47* (2026.01); *H10W 70/66* (2026.01); *H10W 90/00* (2026.01); *H10W 90/701* (2026.01); *H10W 72/07554* (2026.01); *H10W 90/20* (2026.01); *H10W 90/754* (2026.01)

(58) Field of Classification Search
CPC . H01L 2224/48105; H01L 2224/48225; H01L 2225/06503; H01L 23/4334; H01L 23/473; H01L 23/49811; H01L 23/49866; H01L 24/45; H01L 24/48; H01L 25/0655; H01L 25/072; H01L 25/50; H01L 2924/365

See application file for complete search history.

(56) References Cited

U.S. PATENT DOCUMENTS

| | | | | |
|---|---|---|---|---|
| 2007/0256810 A1* | 11/2007 | Di Stefano | ........... | H01L 23/473 |
| | | | | 257/E23.098 |
| 2008/0142943 A1* | 6/2008 | Kim | ........................ | H05K 3/368 |
| | | | | 438/109 |
| 2020/0203249 A1* | 6/2020 | Kim | ........................ | H10W 40/22 |
| 2023/0059142 A1* | 2/2023 | Arora | .................. | H01L 23/4334 |
| 2023/0127494 A1* | 4/2023 | Chen | .................. | H10W 40/228 |
| | | | | 257/712 |
| 2023/0238297 A1* | 7/2023 | Choi | .................. | H01L 23/3677 |
| | | | | 257/668 |

(Continued)

FOREIGN PATENT DOCUMENTS

| | | | |
|---|---|---|---|
| KR | 10-2010-0120006 A | 11/2010 |
| KR | 10-2014-0076102 A | 6/2014 |

(Continued)

*Primary Examiner* — Jaehwan Oh
(74) *Attorney, Agent, or Firm* — Park, Kim & Suh, LLC

(57) ABSTRACT

The present invention relates to a semiconductor package having a heat emitting post bonded thereto and a method of manufacturing the same, and more particularly, to a semiconductor package having a heat emitting post bonded thereto and a method of manufacturing the same that may increase bond strength of the heat emitting post and improve durability of bonding members contacting cooling water.

20 Claims, 6 Drawing Sheets

(56)                    References Cited

U.S. PATENT DOCUMENTS

2025/0118617 A1*   4/2025   Chen ....................... H01L 25/50

FOREIGN PATENT DOCUMENTS

| KR | 10-1472642 | B1 | 12/2014 |
| KR | 10-2019-0133156 | A | 12/2019 |
| KR | 10-2405276 | B1 | 6/2022 |
| KR | 10-2411122 | B1 | 6/2022 |

* cited by examiner

FIG. 1

PREPARE INSULATING SUBSTRATES(S110)

BOND SEMICONDUCTOR CHIPS(S120)

CONNECT TERMINALS(S130)

FORM PACKAGE HOUSING(S140)

BOND HEAT EMITTING METAL LAYERS(S150)

SEMICONDUCTOR PACKAGE HAVING HEAT EMITTING POST BONDED THERETO AND METHOD OF MANUFACTURING THE SAME

CROSS-REFERENCE TO RELATED PATENT APPLICATION

This application claims the benefit of Korean Patent Application No. 10-2023-0028163, filed on Mar. 3, 2023, in the Korean Intellectual Property Office, the disclosure of which is incorporated herein in its entirety by reference.

BACKGROUND OF THE INVENTION

1. Field of the Invention

The present invention relates to a semiconductor package having a heat emitting post bonded thereto and a method of manufacturing the same, and more particularly, to a semiconductor package having a heat emitting post bonded thereto and a method of manufacturing the same that may increase bond strength of the heat emitting post and improve durability of bonding members contacting cooling water.

2. Description of the Related Art

As well known, electrical and electronic components, in particular, semiconductor components generate excessive heat while driving so that heat sink may be formed or a cooling system may be applied to prevent overheat and to maintain driving performance.

Especially, semiconductor components applied to a high power application field may efficiently prevent overheat by using a cooling system that circulates a coolant.

In such cooling system, posts contacting the circulating coolant are inserted and heat transmitted from semiconductor components to the posts is cooled. Generally, posts are bonded to a substrate by using a bonding member containing Ag or Cu interposed therebetween by soldering, sintering, or brazing.

However, as the bonding member contacts a coolant of a cooling system, the bonding member is oxidized or corroded and thereby, deteriorated. Accordingly, bond strength between the bonding member and posts may be lowered.

In this regard, there is a demand for technology that may increase bond strength of the heat emitting posts and improve durability of a bonding member contacting cooling water and heat emitting efficiency.

SUMMARY OF THE INVENTION

The present invention provides a semiconductor package having a heat emitting post bonded thereto and a method of manufacturing the same that may increase bond strength of the heat emitting post and improve durability of bonding members contacting cooling water.

According to an aspect of the present invention, there is provided a semiconductor package having a heat emitting post bonded thereto including: one or more insulating substrates including one or more insulating layers; one or more metal pattern layers formed on one sides of the insulating layers; one or more heat emitting metal layers formed on the other sides of the insulating layers; one or more semiconductor chips which are bonded on the metal pattern layers and include one or more electrical connecting members bonded thereto; a package housing covering cover one or more semiconductor chips and partially or entirely covering the metal pattern layers; one or more terminals including one end electrically or structurally connected to the insulating substrate and the other end exposed to the outside of the package housing; and one or more heat emitting posts bonded to the heat emitting metal layers by using bonding members interposed therebetween and exposed to the lower surface, the upper surface, or lower and upper surfaces of the package housing, wherein a horizontal bonding distance between one side of the bonding member and the heat emitting metal layer is greater than a horizontal bonding distance between the other side of the bonding member and the heat emitting post, and the side surface of the bonding member is partially plated with one or more metal layers or entirely includes the plating layer.

Here, a metal bonding layer having a thickness smaller than that of the metal pattern layer or the heat emitting metal layer may be interposed between the insulating layer and the metal pattern layer and between the insulating layer and the heat emitting metal layer.

The bonding member may be formed of a material comprising any one of Sn, Ag, Au, Cu, Ti, Ni, Pd, and ceramic or a composite material containing 30% or more of any one thereof.

A thickness of the bonding member may be 10 μm through 5 mm.

A thickness of the plating layer may be 1 μm through 20 μm.

The bonding member may be formed of a material having a melting point of 100° C. through 250° C.

Shear strength of the bonding member may be 5 kgf through 100 kgf.

The heat emitting posts may have a cylindrical shape, a cuboid shape, or a cubical shape.

A main metal forming the heat emitting post may be Cu having purity of above 70% or an alloy containing Cu.

A main metal forming the heat emitting post may be Al having purity of above 50% or an alloy containing Al.

The heat emitting metal layer may include a metal plating layer containing 70% or more of Ni on the surface thereof.

The metal plating layer may be an electroless plating layer or an electrolyte plating layer.

The metal pattern layers and the heat emitting metal layers may include Cu or Al.

The side of the bonding member may be bonded to the surface of the heat emitting metal layer at an angle of 3° through 85° so as to bonded to the surface of the heat emitting metal layer.

The package housing may be formed of a composite material containing epoxy.

The semiconductor chip may be a semiconductor device including any one of MOSFET, IGBT, a GaN device, a SiC device, and a Ga device.

The semiconductor package may further include a cooling system bonded to the insulating substrates and wherein one or more heat emitting posts may directly contact cooling water that circulates the inside of the cooling system.

The electrical connecting member may be a wire, a metal clip formed of a bent metal plate, or a metal spacer.

The heat emitting metal layer and the heat emitting post may be formed of the same material.

The insulating layer may be formed of a single material comprising any one of $Al_2O_3$, AlN, and $Si_3N_4$ or a composite material containing at least any one thereof.

According to another aspect of the present invention, there is provided a method of manufacturing a semiconductor package having a heat emitting post bonded thereto including: a first step which prepares insulating substrates comprising one or more insulating layers, one or more metal pattern layers formed on one sides of the insulating layers, and one or more heat emitting metal layers formed on the other sides of the insulating layers; a second step which bonds one sides of one or more semiconductor chips onto the metal pattern layers and bonds one or more electrical connecting members to the other sides of the semiconductor chips; a third step which electrically or structurally connects one or more terminals to the insulating substrates; a fourth step which forms a package housing in such a way that the terminals are partially exposed to the outside, one or more semiconductor chips are covered, and the metal pattern layers are partially or entirely covered; and a fifth step which bonds the heat emitting posts to the heat emitting metal layer by using bonding members interposed therebetween so that the heat emitting posts are exposed to the lower surface, the upper surface, or lower and upper surfaces of the package housing, wherein a horizontal bonding distance between one side of the bonding member and the heat emitting metal layer is greater than a horizontal bonding distance between the other side of the bonding member and the heat emitting post, and the side surface of the bonding member is partially plated with one or more metal layers or entirely includes the plating layer.

Here, the fifth step may be performed before installing of the semiconductor chips in the second step in such a way that the heat emitting posts are bonded to the heat emitting metal layer in advance.

The heat emitting posts may be bonded to the heat emitting metal layer by using the bonding members interposed therebetween at a temperature of 100° C. through 300° C.

In the fourth step, the heat emitting metal layer may be partially or entirely exposed to the lower surface, the upper surface, or lower and upper surfaces of the package housing.

BRIEF DESCRIPTION OF THE DRAWINGS

The above and other features and advantages of the present invention will become more apparent by describing in detail exemplary embodiments thereof with reference to the attached drawings in which:

FIG. 1 is a semiconductor package having a heat emitting post bonded thereto according to an embodiment of the present invention;

DETAILED DESCRIPTION OF THE INVENTION

Figure 2A:
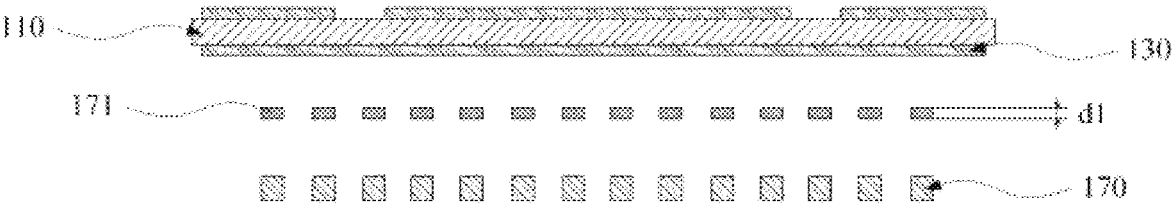
FIGS. 2A through 3B respectively illustrate a bonding structure of the semiconductor package having a heat emitting post bonded thereto of FIG. 1.

Hereinafter, embodiments of the present invention will be described more fully with reference to the accompanying drawings.

A semiconductor package having a heat emitting post bonded thereto includes an insulating substrate on which an insulating layer 110 is formed, a metal pattern layer 120 formed on one side of the insulating layer 110, a heat emitting metal layer 130 formed on the other side of the insulating layer 110, a semiconductor chip 140 which is bonded on the metal pattern layer 120 and includes an electrical connecting member 141 bonded thereto, a package housing 150, a terminal 160, and a heat emitting post 170 bonded to the heat emitting metal layer 130 by using a bonding member 171 interposed therebetween and exposed to a lower surface, an upper surface, or lower and upper surfaces of the package housing 150. Here, a horizontal bonding distance H2 between one side of the bonding member 171 and the heat emitting metal layer 130 is greater than a horizontal bonding distance H1 between the other side of the bonding member 171 and the heat emitting post 170. Also, the side surface of the bonding member 171 is partially plated with one or more metal layers or entirely includes a plating layer 172. Accordingly, bond strength between the bonding member 171 and the heat emitting post 170 may increase and durability of the bonding member 171 which contacts cooling water may improve.

Figure 1:
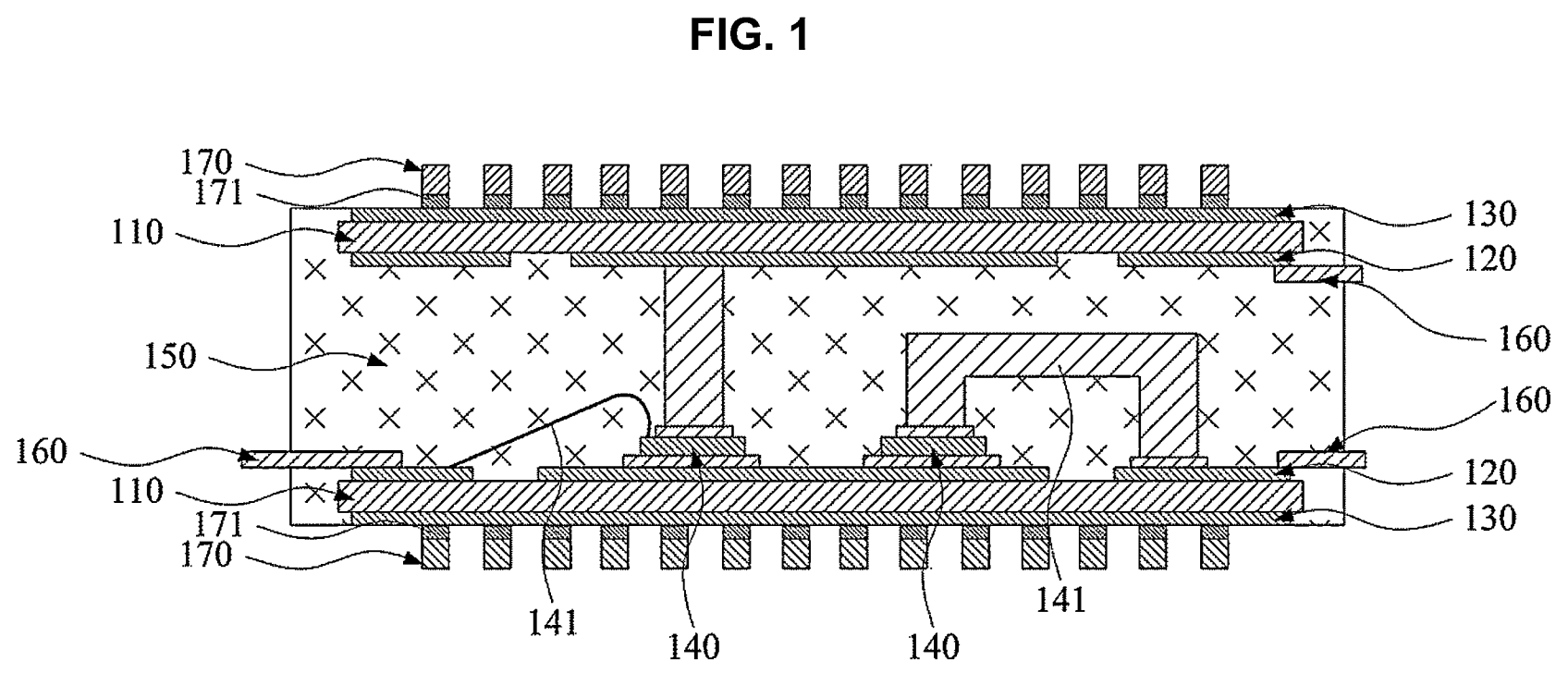

Hereinafter, the semiconductor package having a heat emitting post bonded thereto above will be described in more detail with reference to FIGS. 1 through 5.

First, the semiconductor package includes one or more insulating substrates including one or more insulating layers 110, one or more metal pattern layers 120 formed on one sides of the insulating layers 110, and one or more heat emitting metal layers 130 formed on the other sides of the insulating layers 110.

That is, such insulating substrates may include one or more insulating layers 110, one or more metal pattern layers 120, and one or more heat emitting metal layers 130.

Here, the insulating layers 110 may be formed of a single material including any one of $Al_2O_3$, AlN, $Si_3N_4$, and PI or a composite material including at least any one thereof.

Also, the insulating substrate including the insulating layers 110, the metal pattern layers 120, and the heat emitting metal layers 130 may be formed on an upper substrate, a lower substrate, or both upper and lower substrates of a semiconductor package.

In the insulating substrate, a metal bonding layer (not illustrated) having a thickness smaller than that of the metal pattern layer 120 or the heat emitting metal layer 130 may be interposed between the insulating layer 110 and the metal pattern layer 120 and between the insulating layer 110 and the heat emitting metal layer 130 to be bonded to each other.

In addition, the metal pattern layers 120 and the heat emitting metal layers 130 may be formed of Cu or Al, more preferably, Cu.

Next, the lower surfaces of one or more semiconductor chips 140 are bonded on the metal pattern layers 120 and one or more electrical connecting members 141 are bonded to the upper surfaces of the semiconductor chips 140 so that an electrical signal may be applied.

Here, the semiconductor chip 140 may be a power conversion semiconductor device including any one of MOSFET, IGBT, a GaN device, a SiC device, and a Ga device and may be applied to an inverter, a converter, or an On Board Charger (OBC) used to convert or control power. Here, since excessive heat generates while converting power into power of a specific current, a specific voltage, or a specific frequency, a cooling system 180 (refer to FIG. 5) may be used to cool the heat.

Moreover, as illustrated in FIG. 1, the electrical connecting member 141 may be a wire, a metal clip formed of a bent metal plate, or a metal spacer having a hexahedral form or a cylindrical form.

Next, the package housing 150 is molded to cover one or more semiconductor chips 140 and to partially or entirely cover the metal pattern layers 120 and may be formed of a composite material containing, for example, epoxy.

Next, one end of the terminal 160 is electrically or structurally connected to the insulating substrate, more preferably, the metal pattern layer 120, and the other end of the terminal 160 is extended by a certain length to be exposed to the outside of the package housing 150.

Next, the heat emitting posts 170 are formed of a material having excellent thermal conductivity, are bonded to the heat emitting metal layer 130 by using the bonding members 171 interposed therebetween, and are formed to be exposed to the lower surface, the upper surface, or lower and upper surfaces of the package housing 150 so that heat generated from the semiconductor package may be transmitted to the outside.

Figure 3A:
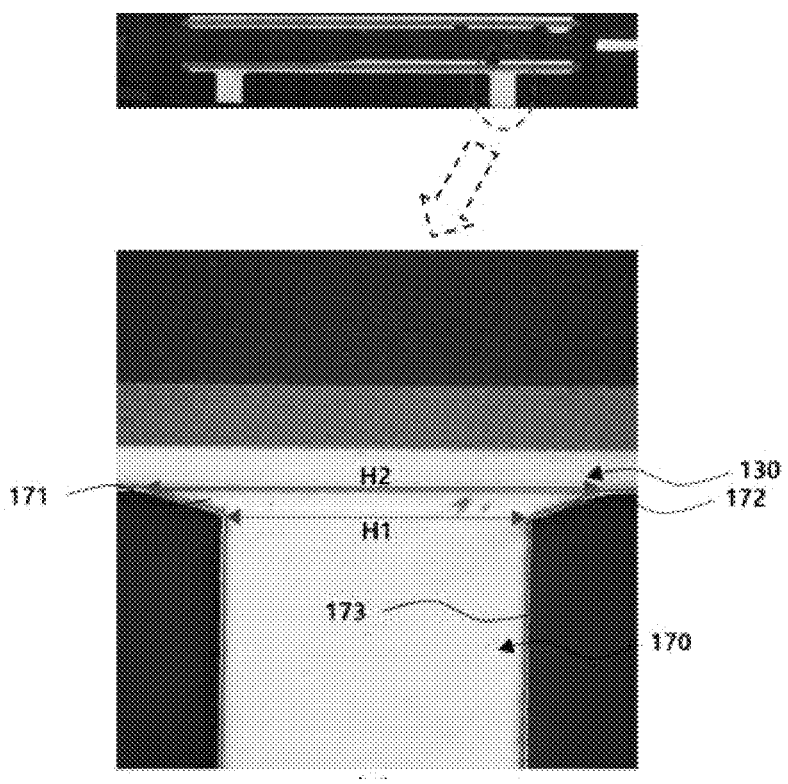

Here, referring to FIG. 3A, the horizontal bonding distance H2 between one side of the bonding member 171 and the heat emitting metal layer 130 is greater than the horizontal bonding distance H1 between the other side of the bonding member 171 and the heat emitting post 170. Accordingly, adhesive strength between the heat emitting metal layer 130 and the heat emitting posts 170 increases to secure structural stability and the bonding members 171 function as heat emitting paths so that excellent heat emission effect may be provided.

Figure 3B:
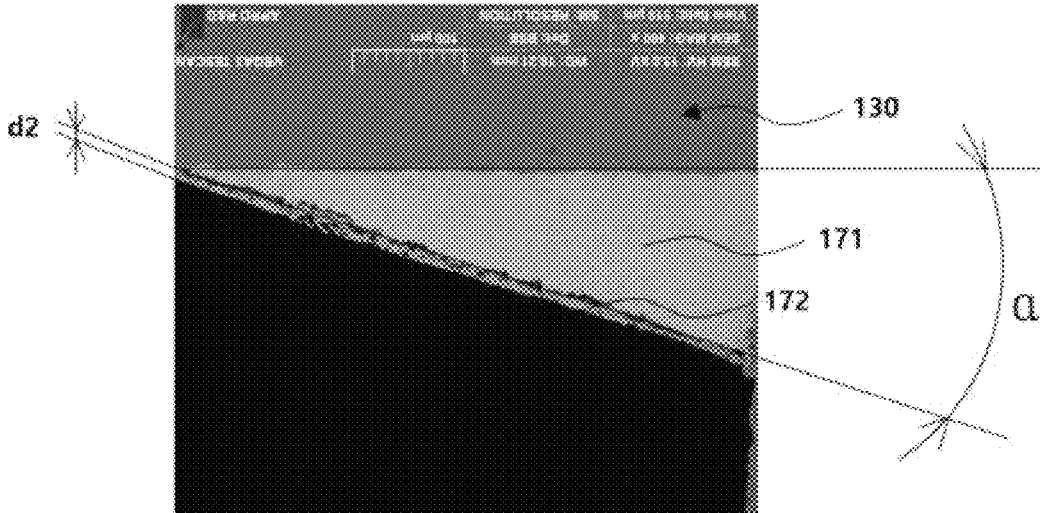

Also, referring to FIG. 3B, the side surface of the bonding member 171 is partially plated with one or more metal layers having excellent oxidation resistance or entirely includes the plating layer 172. Accordingly, the plating layer 172 prevents oxidization, corrosion, or deterioration of the bonding member 171 which may occur due to direct contact with cooling water of the cooling system 180. In this regard, durability of the bonding member 171 may be improved, and adhesive strength and bond strength between the bonding member 171 and the heat emitting post 170 may increase.

The bonding member 171 may be interposed between the heat emitting metal layer 130 and the heat emitting post 170 and thereby, the heat emitting metal layer 130 and the heat emitting post 170 may be bonded to each other by soldering, sintering, or brazing. The bonding member 171 may be formed of a material including any one of Sn, Ag, Au, Cu, Ti, Ni, Pd, and ceramic or a composite material containing 30% or more of any one thereof.

Referring to FIG. 2A, a thickness d1 of the bonding member 171 may be 5 μm through 5 mm, more preferably, 10 μm through 5 mm. Accordingly, bond strength between the heat emitting metal layer 130 and the heat emitting post 170 may be well-maintained.

Also, the bonding member 171 may be formed of a material having a melting point of 100° C. through 250° C. and shear strength thereof may be 5 kgf through 100 kgf.

In addition, referring to FIG. 3B, the plating layer 172 may be formed of Ni having excellent oxidation resistance and a thickness d2 thereof may be 1 μm through 20 μm.

Figure 4A:
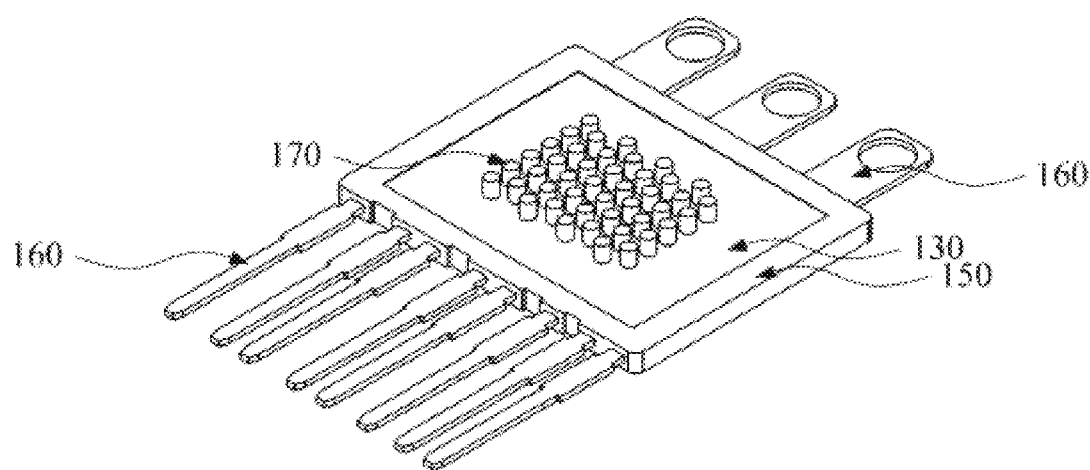
FIGS. 4A and 4B are realization views of the semiconductor package having a heat emitting post bonded thereto of FIG. 1.
Figure 4B:
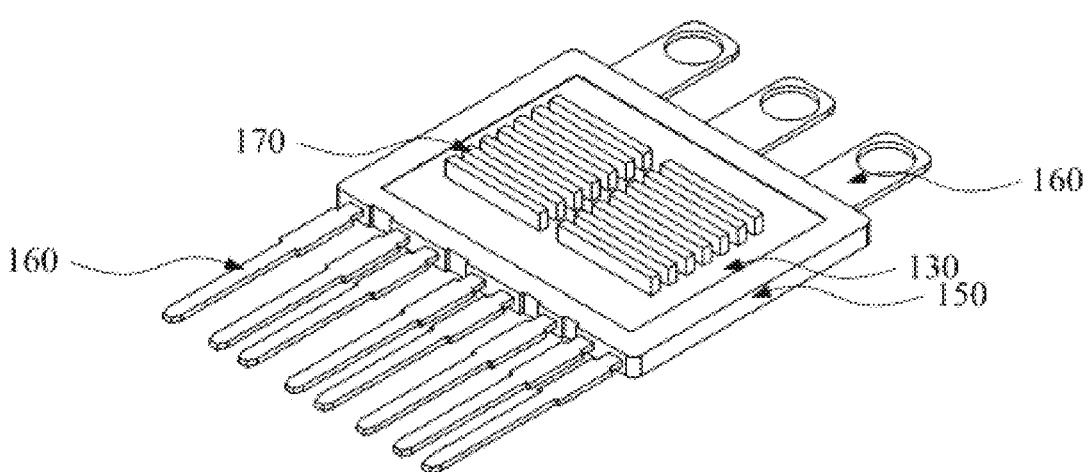

As illustrated in FIGS. 4A and 4B, the heat emitting posts 170 may have a cylindrical shape, a cuboid shape, or a cubical shape and may be uprightly arranged in a specific pattern on the surface of the heat emitting metal layer 130.

Also, a main metal forming the heat emitting post 170 is Cu having purity of above 70%, more preferably, above 90%, an alloy containing Cu, or Al having purity of above 50%, more preferably, above 90%, or an alloy containing Al. Accordingly, excellent thermal conductivity may be provided.

In addition, the heat emitting post 170 may be formed of a material that is same as that of the heat emitting metal layer 130.

Referring to FIG. 3A, as in the bonding member 171, the heat emitting post 170 may include a plating layer 173 containing Ni on the surface thereof and thereby, the plating layer 173 may prevent the heat emitting post 170 from being directly contacted to cooling water of the cooling system 180, oxidized or corroded.

Figure 2B:
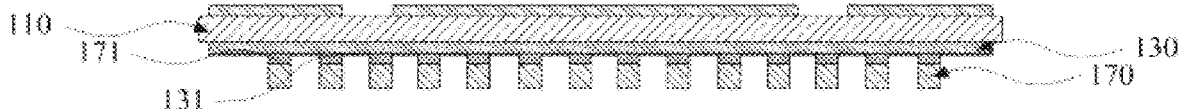

Referring to FIG. 2B, the heat emitting metal layer 130 may include a metal plating layer 131 containing 70% or more of Ni on the surface thereof, more preferably, 80% or more, and thereby, metal plating layer 131 may prevent the heat emitting metal layer 130 from being directly contacted to cooling water of the cooling system 180, oxidized or corroded.

Here, the metal plating layer 131 may be an electroless plating layer or an electrolyte plating layer, more preferably, an electroless plating layer.

Also, referring to FIG. 3B, the side of the bonding member 171 is bonded to the surface of the heat emitting metal layer 130 at an angle α of 3° through 85° and thereby, the bonding member 171 is extended to the heat emitting post 170. Accordingly, bond strength between the heat emitting metal layer 130 and the heat emitting post 170 may increase and the bonding member 171 may function as a heat emitting path so that excellent heat emission effect may be provided.

Figure 5:
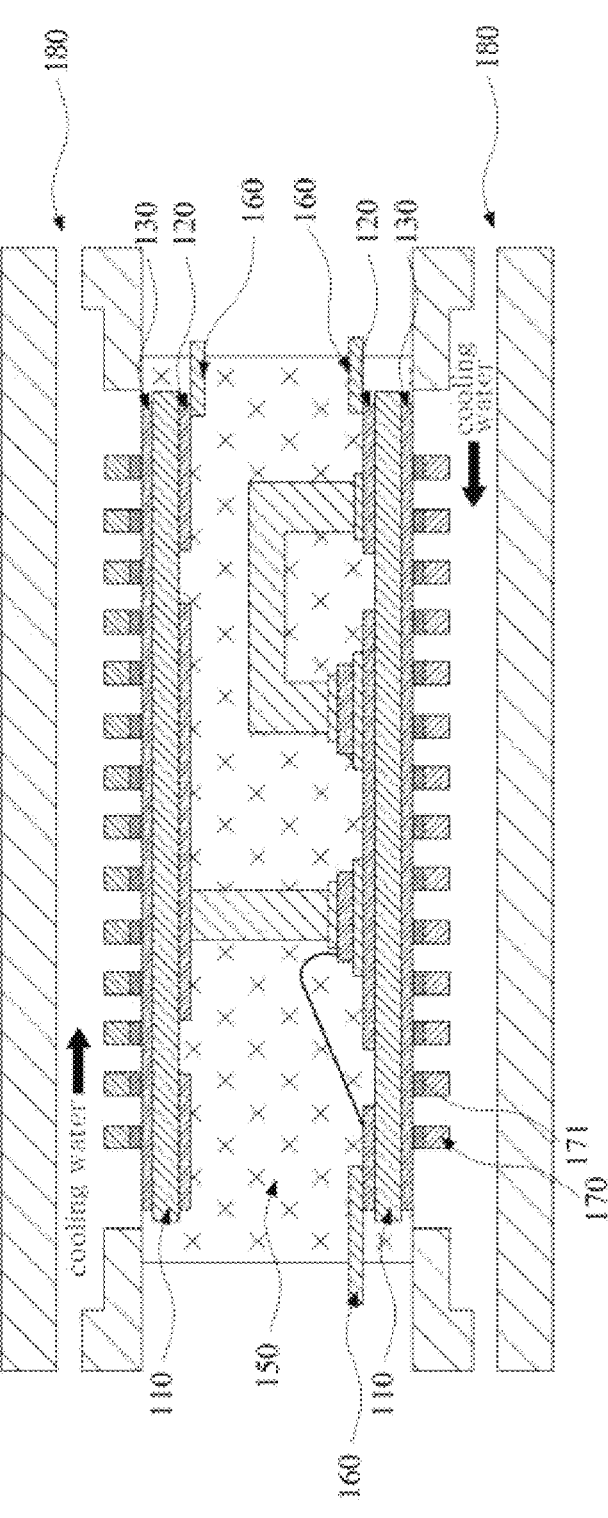
FIG. 5 illustrates a bonding structure between the semiconductor package having a heat emitting post bonded thereto of FIG. 1 and a cooling system.

Referring to FIG. 5, the cooling system 180 is further included, wherein the cooling system 180 may be combined to an insulating substrate and may emit heat by circulating cooling water. One or more heat emitting posts 170 may directly contact cooling water that circulates the inside of the cooling system 180 and thereby, may efficiently cool heat.

Figure 6:
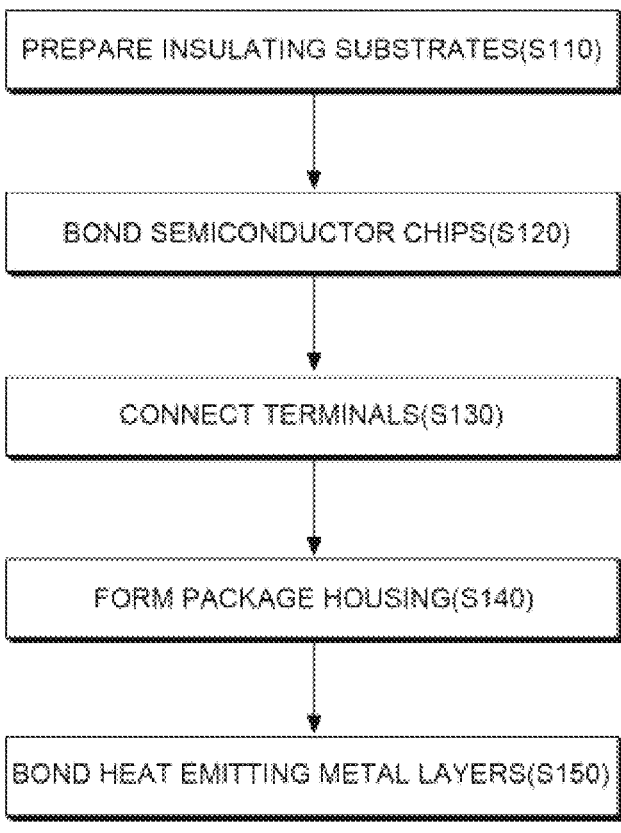
FIG. 6 is a flowchart schematically illustrating a method of manufacturing a semiconductor package having a heat emitting post bonded thereto according to another embodiment of the present invention.

Referring to FIG. 6, a method of manufacturing a semiconductor package having a heat emitting post bonded thereto according to another embodiment of the present invention includes a first step which prepares insulating substrates including one or more insulating layers 110, one or more metal pattern layers 120 formed on one sides of the insulating layers 110, and one or more heat emitting metal layers 130 formed on the other sides of the insulating layers 110 in operation S110, a second step which bonds one sides of one or more semiconductor chips 140 onto the metal pattern layers 120 and bonds one or more electrical connecting members 141 to the other sides of the semiconductor chips 140 in operation S120, a third step which electrically or structurally connects the terminals 160 to the insulating substrates in operation S130, a fourth step which forms the package housing 150 in such a way that the terminals 160 are partially exposed to the outside, one or more semiconductor chips 140 are covered, and the metal pattern layers 120 are partially or entirely covered, in operation S140, and a fifth step which bonds the heat emitting posts 170 to the heat emitting metal layer 130 by using the bonding members 171 interposed therebetween so that the heat emitting posts 170 are exposed to the lower surface, the upper surface, or lower and upper surfaces of the package housing 150 in operation S150.

Here, as described above with reference to FIGS. 3A and 3B, the horizontal bonding distance H2 between one side of the bonding member 171 and the heat emitting metal layer 130 is greater than the horizontal bonding distance H1 between the other side of the bonding member 171 and the heat emitting post 170. Accordingly, adhesive strength between the heat emitting metal layer 130 and the heat emitting posts 170 increases to secure structural stability of the heat emitting posts 170 and the bonding members 171 function as heat emitting paths so that excellent heat emission effect may be provided.

Also, referring to FIG. 3B, the side surface of the bonding member 171 is partially plated with one or more metal layers or entirely includes the plating layer 172 formed thereon. Accordingly, the plating layer 172 prevents the bonding member 171 from being directly contacted to cooling water of the cooling system 180, oxidized or corroded. In this regard, durability of the bonding member 171 may be improved.

Here, bonding of the heat emitting metal layer 130 in operation S150 may be performed before installing of the semiconductor chips 140 in operation S120 in such a way that the heat emitting posts 170 are bonded to the heat emitting metal layer 130 in advance.

Also, the heat emitting posts 170 may be bonded to the heat emitting metal layer 130 by using the bonding members 171 interposed therebetween at a temperature of 100° C. through 300° C.

In addition, in operation S140, the heat emitting metal layer 130 is partially or entirely exposed to the lower surface, the upper surface, or lower and upper surfaces of the package housing 150 so as to contact cooling water of the cooling system 180. In this regard, heat may be emitted.

According to the semiconductor package having a heat emitting post bonded thereto and the method of manufacturing the same described above, the bonding distance and the bonding angle of the bonding members are optimized to increase bond strength between the heat emitting metal layer and the heat emitting posts. Also, the plating layers are respectively formed on the bonding members, the heat emitting metal layer, and the heat emitting posts to increase oxidation resistance so that oxidation and corrosion occurring due to contact of cooling water included in the cooling system may be prevented to improve durability.

According to the present invention, the bonding distance and the bonding angle of the bonding members are optimized to increase bond strength between the heat emitting metal layer and the heat emitting posts. Also, the plating layers are respectively formed on the bonding members, the heat emitting metal layer, and the heat emitting posts to increase oxidation resistance so that oxidation and corrosion occurring due to contact of cooling water included in the cooling system may be prevented to improve durability.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package having heat emitting posts bonded thereto comprising:

a lower insulating substrate comprising a lower insulating layer, a metal pattern layer formed on an upper surface of the lower insulating layer, and a heat emitting metal layer formed on a lower surface of the lower insulating layer;

at least one semiconductor chip which is bonded on the metal pattern layer, wherein an electrical connecting member is bonded to the at least one semiconductor chip;

a package housing covering the at least one semiconductor chip and partially or entirely covering the metal pattern layer;

at least one terminal having a first end electrically connected to the metal pattern layer and a second end exposed to an outside of the package housing; and a plurality of heat emitting posts bonded to a lower surface of the heat emitting metal layer and exposed to a lower surface of the package housing, wherein a plurality of bonding members are interposed between the lower surface of the heat emitting metal layer and the plurality of heat emitting posts, respectively, wherein a horizontal width of an upper end of each bonding member is greater than a horizontal width of a lower end of each bonding member, and a side surface of each bonding member is plated with a plating layer.

2. The semiconductor package of claim 1, wherein a metal bonding layer having a thickness smaller than that of the metal pattern layer or the heat emitting metal layer is interposed between the lower insulating layer and the metal pattern layer and between the lower insulating layer and the heat emitting metal layer.

3. The semiconductor package of claim 1, wherein the bonding members are formed of a material comprising any one of Sn, Ag, Au, Cu, Ti, Ni, Pd, and ceramic or a composite material containing 30% or more of any one thereof.

4. The semiconductor package of claim 1, wherein a thickness of the bonding members are 10 μm through 5 mm.

5. The semiconductor package of claim 1, wherein a thickness of the plating layer is 1 μm through 20 μm.

6. The semiconductor package of claim 1, wherein the bonding members are formed of a material having a melting point of 100° C. through 250° C.

7. The semiconductor package of claim 1, wherein a shear strength of the bonding members is 5 kgf through 100 kgf.

8. The semiconductor package of claim 1, wherein the heat emitting posts have a cylindrical shape, a cuboid shape, or a cubical shape.

9. The semiconductor package of claim 1, wherein a main metal forming the heat emitting posts is Cu having purity of above 70% or an alloy containing Cu.

10. The semiconductor package of claim 1, wherein a main metal forming the heat emitting posts is Al having purity of above 50% or an alloy containing Al.

11. The semiconductor package of claim 1, wherein the heat emitting metal layer comprises a metal plating layer containing 70% or more of Ni on the surface thereof.

12. The semiconductor package of claim 1, wherein the metal pattern layer and the heat emitting metal layer comprise Cu or Al.

13. The semiconductor package of claim 1, wherein an angel between the side surface of each bonding member and the lower surface of the heat emitting metal layer is 3° through 85°.

14. The semiconductor package of claim 1, wherein the package housing is formed of a composite material containing epoxy.

15. The semiconductor package of claim 1, wherein the at least one semiconductor chip is a semiconductor device comprising any one of MOSFET, IGBT, a GaN device, a SiC device, and a Ga device.

16. The semiconductor package of claim 1, further comprising a cooling system bonded to the lower insulating substrate and wherein the heat emitting posts directly contact cooling water that circulates an inside of the cooling system.

17. The semiconductor package of claim 1, wherein the electrical connecting member is a wire, a metal clip formed of a bent metal plate, or a metal spacer.

18. The semiconductor package of claim 1, wherein the heat emitting metal layer and the heat emitting posts are formed of a same material.

19. The semiconductor package of claim 1, wherein the lower insulating layer is formed of a single material comprising any one of $Al_2O_3$, AlN, and $Si_3N_4$ or a composite material containing at least any one thereof.

20. A method of manufacturing a semiconductor package having heat emitting posts bonded thereto comprising:

preparing a lower insulating substrate comprising a lower insulating layer, a metal pattern layer formed on an upper surface of the lower insulating layer, and a heat emitting metal layer formed on a lower surface of the lower insulating layer;

bonding at least one semiconductor chip onto the metal pattern layer and bonding an electrical connecting member to the at least one semiconductor chip;

connecting at least one terminal to the metal pattern layer;

forming a package housing partially covering the at least one terminal, covering the at least one semiconductor chip, and partially or entirely covering the metal pattern layer; and bonding a plurality of heat emitting posts to a lower surface of the heat emitting metal layer, the heat emitting posts being exposed to a lower surface of the package housing, wherein a plurality of bonding members are interposed between the lower surface of the heat emitting metal layer and the plurality of heat emitting posts, respectively, wherein a horizontal width of an upper end of each bonding member is greater than a horizontal width of a lower end of each bonding member, and a side surface of each bonding member is plated a plating layer.

* * * * *